US008957737B2

(12) United States Patent
Yoder et al.

(10) Patent No.: US 8,957,737 B2
(45) Date of Patent: Feb. 17, 2015

(54) METHODS AND SYSTEMS FOR GENERATING MILLIMETER-WAVE OSCILLATIONS

(75) Inventors: Paul Douglas Yoder, Richmond Hill, GA (US); Sriraaman Sridharan, Savannah, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 38 days.

(21) Appl. No.: 13/574,605

(22) PCT Filed: Jan. 31, 2011

(86) PCT No.: PCT/US2011/023235
§ 371 (c)(1),
(2), (4) Date: Jul. 21, 2012

(87) PCT Pub. No.: WO2011/094715
PCT Pub. Date: Aug. 4, 2011

(65) Prior Publication Data
US 2012/0293272 A1 Nov. 22, 2012

Related U.S. Application Data

(60) Provisional application No. 61/299,440, filed on Jan. 29, 2010.

(51) Int. Cl.
*H03B 9/12* (2006.01)
*H01L 29/778* (2006.01)
(Continued)

(52) U.S. Cl.
CPC . *H01Q 9/285* (2013.01); *H01Q 1/38* (2013.01)
USPC ......... 331/108 R; 331/104; 257/194; 257/195

(58) Field of Classification Search
CPC .............. H03B 9/00; H03B 9/12; H03B 7/00;
H03B 2009/00; H03B 2009/12; H03B 2200/0028; H03B 2200/0032; H03B 2200/0084; H01L 29/1029; H01L 29/778; H01L 29/7782–29/7787
USPC .................. 331/104, 107 R, 108 R, 132, 115; 257/194, 192, 195, 289
See application file for complete search history.

(56) References Cited

U.S. PATENT DOCUMENTS 5,258,624 A 11/1993 Battersby et al.
5,405,797 A 4/1995 Brugger
(Continued)

OTHER PUBLICATIONS

Deng et al., "Millimeter Wave Emission from GaN High Electron Mobility Transistor", Applied physics letters 84.1 (Jan. 2004): 70-72.*

(Continued)

*Primary Examiner* — Ryan Johnson
(74) *Attorney, Agent, or Firm* — Troutman Sanders LLP; Ryan A. Schneider; Dustin B. Weeks

(57) ABSTRACT

The various embodiments of the present invention provide improved methods and circuits for generating millimeter-wave oscillations. Generating millimeter-wave oscillations may involve providing a semiconductor device comprising at least two terminals and a polar heterojunction formed from two semiconductor materials. A voltage bias may be applied to at least two terminals of the device in which the voltage enhances a two-dimensional electron gas (2DEG) layer at the polar heterojunction and produces a sharply-peaked but spatially-localized electric field within the 2DEG with a large longitudinal component, wherein the longitudinal component of the electric field serves as a nucleation site for a plurality of propagating dipole domains observable as a plurality of self-sustaining millimeter-wave oscillations.

13 Claims, 10 Drawing Sheets

(51) Int. Cl.
*H01Q 9/28* (2006.01)
*H01Q 1/38* (2006.01)

(56) References Cited

U.S. PATENT DOCUMENTS

| | | | |
|---|---|---|---|
| 6,518,637 | B1 | 2/2003 | Thompson et al. |
| 6,777,684 | B1 | 8/2004 | Volkov et al. |
| 7,638,817 | B2 * | 12/2009 | Shur et al. ............... 257/187 |
| 2008/0217538 | A1 | 9/2008 | Ouchi et al. |

OTHER PUBLICATIONS

Peale et al., "Tunable THz plasmon resonances in InGaAs/InP HEMT", SPIE Defense, Security, and Sensing. International Society for Optics and Photonics, Apr. 30, 2009.*

Marso et al., "A Novel InGaAs Schottky—2DEG Diode", Indium Phosphide and Related Materials, 1993. Conference Proceedings., Fifth International Conference on. IEEE, 1993.*

Ambacher et al., "Two-dimensional electron gases induced by spontaneous and piezoelectric polarization charges in N- and Ga-face AlGaN/GaN heterostructures", Journal of Applied Physics 85.6 (1999): 3222-3233.*

Dyakonov et al., "Shallow Water Analogy for a Ballistic Field Effect Transistor: New Mechanism of Plasma Wave Generation by dc Current", Electron Devices, IEEE Transactions on 43.10 (1996): 1640-1645.*

Dyakonova et al. , "Room-temperature terahertz emission from nanometer field-effect transistors", Applied physics letters 88.14 (2006): 141906-141906.*

Knap et al. ,"Plasma wave oscillations in nanometer field effect transistors for terahertz detection and emission", Journal of Physics: Condensed Matter 20.38 (2008): 384205.*

Russer, Peter, "Si and SiGe Millimeter-Wave Integrated Circuits", IEEE Transactions on Microwave Theory and Techniques, vol. 46, No. 5, May 1998, pp. 590-603.

International Search Report and Written Opinion dated May 2, 2011 for related PCT Patent Application No. PCT/US2011/023235.

* cited by examiner

METHODS AND SYSTEMS FOR GENERATING MILLIMETER-WAVE OSCILLATIONS

CROSS-REFERENCE TO RELATED APPLICATIONS

This application claims the benefit of U.S. Provisional Patent Application Ser. No. 61/299,440, filed 29 Jan. 2010, which is incorporated herein by reference in its entirety as if fully set forth below.

TECHNICAL FIELD

The present invention relates generally to methods and systems for generating high-frequency oscillations, and more particularly to methods and systems for generating millimeter-wave and terahertz oscillations using a semiconductor device.

BACKGROUND

Millimeter-wave signals increasingly find application in various fields and applications. In the telecommunications arena, for example, the United States has designated certain frequency bands in the millimeter-wave band for areas of future expansion. For example, the 38.6-40.0 GHz band has been chosen for licensed high-speed microwave data links, which experimental systems have shown capable of 10-Mbit/s over a microwave data link. Additionally, the 60 GHz band has been set aside for unlicensed short range data links providing data throughputs up to 2.5 Gbit/s. Many view the 60 GHz band as a solution to local loop bottlenecks in terrestrial metro and wide area networks. Indeed, an IEEE wireless standard dedicated to the 60 GHz range (802.11ad; "Very High Throughput 60 GHz") is currently under development with the goal of encouraging the widespread adoption of 60 GHz wireless networks and related technologies. Furthermore, millimeter-wave signals find potential applications in outer space by way of highly-directional inter-satellite and extra-terrestrial communications. Still further applications for millimeter-wave signals exist in the medical industry, particularly in diagnostics and monitoring procedures such as non-invasive brain mapping, non-destructive in-situ testing.

New areas of application have also where millimeter-wave signals were previously thought to be ill-suited due to their perceived susceptibility to atmospheric attenuation. Specifically, certain low-attenuation windows in the millimeter-wave range (e.g., 35, 94, 140, and 220 GHz) have been found to be relatively immune from atmospheric attenuation. As a consequence, an entire host of additional applications for millimeter-wave signals in these windows is now likely, including target tracking and imaging, all-weather radiometry, and remote sensing.

Presently known oscillators for generating millimeter-wave signals, however, are ill-suited for several of these potential applications. Gunn diodes, although theorized for microwave through terahertz signal generation, are subject to severe tradeoffs between frequency and output power. Even in very mature material systems, Gunn diodes have not been realized in practice which offer sufficient power generation for most applications beyond the microwave regime for this very reason. In the case of the emerging families of wide bandgap compound semiconductor materials, the very doping levels which would be required for a Gunn diode to function also likely degrade electron velocity to the point of precluding Gunn oscillations in the first place. Moreover, travelling wave tubes, the devices most commonly used to generate millimeter waves at room temperature, have significant drawbacks including large size, high cost, and relative fragility. As a result, they too have significant shortcomings when it comes to implementing them in all of the potential applications available to millimeter-wave signals.

As a result, there remains a need for improved methods and systems for generating millimeter-wave oscillations. It is to this end that the methods and systems disclosed by the various embodiments of the present inventions are directed.

SUMMARY

Consistent with embodiments of the present invention, methods and circuits for generating millimeter-wave oscillations are provided.

In accordance with one embodiment, a method for generating millimeter-wave oscillations comprises providing a semiconductor device comprising at least two terminals and a polar heterojunction formed from two semiconductor materials. The method further comprises applying a voltage bias to the terminals, the voltage biases being adapted to enhance a two-dimensional electron gas (2DEG) layer at the polar heterojunction and produce a sufficiently large longitudinal component of an electric field within the 2DEG. The produced longitudinal component of the electric field serves as a nucleation site for a plurality of propagating dipole domains observable as a plurality of self-sustaining millimeter-wave oscillations.

According to another embodiment, a method for generating millimeter-wave oscillations includes providing a semiconductor device comprising at least two terminals and a polar heterojunction formed from two semiconductor materials. The method further includes applying a first set of voltage biases to the terminals in a first mode and applying a second set of voltage biases to the terminals in a second mode. Further according to the method, the first voltage biases and the second voltage biases are adapted to enhance a two-dimensional electron gas (2DEG) layer at the polar heterojunction and produce a sufficiently large longitudinal component of an electric field within the 2DEG. The produced longitudinal component of the electric field serves as a nucleation site for a plurality of propagating dipole domains observable as a plurality of self-sustaining millimeter-wave oscillations. Still further to the exemplary method, the first frequency associated with the first mode is higher than the second frequency associated with the second mode.

In accordance another embodiment, an oscillator circuit may include a semiconductor device having at least two terminals and a polar heterojunction formed from two semiconductor materials, voltage sources, and a resistive element. Further according to this exemplary circuit, the voltage sources and resistive element are configured to supply voltage biases to the device terminals, where the voltage biases are sufficient to enhance a two-dimensional electron gas (2DEG) layer at the polar heterojunction, and produce a longitudinal component of an electric field within the 2DEG. The longitudinal component of the electric field serves as a nucleation site for a plurality of propagating dipole domains observable as a plurality of self-sustaining millimeter-wave oscillations.

It is to be understood that both the foregoing general description and the following detailed description are exemplary and explanatory only, and should not be considered restrictive of the scope of the invention, as described and claimed. Further, features and/or variations may be provided in addition to those set forth herein. For example, embodiments of the invention may be directed to various combinations and sub-combinations of the features described in the detailed description.

BRIEF DESCRIPTION OF THE DRAWINGS

The accompanying drawings, which are incorporated in and constitute a part of this specification, illustrate various embodiments of the invention and, together with the description, serve to explain various embodiments and aspects of the present invention. In the drawings.

DETAILED DESCRIPTION

Figure 1:
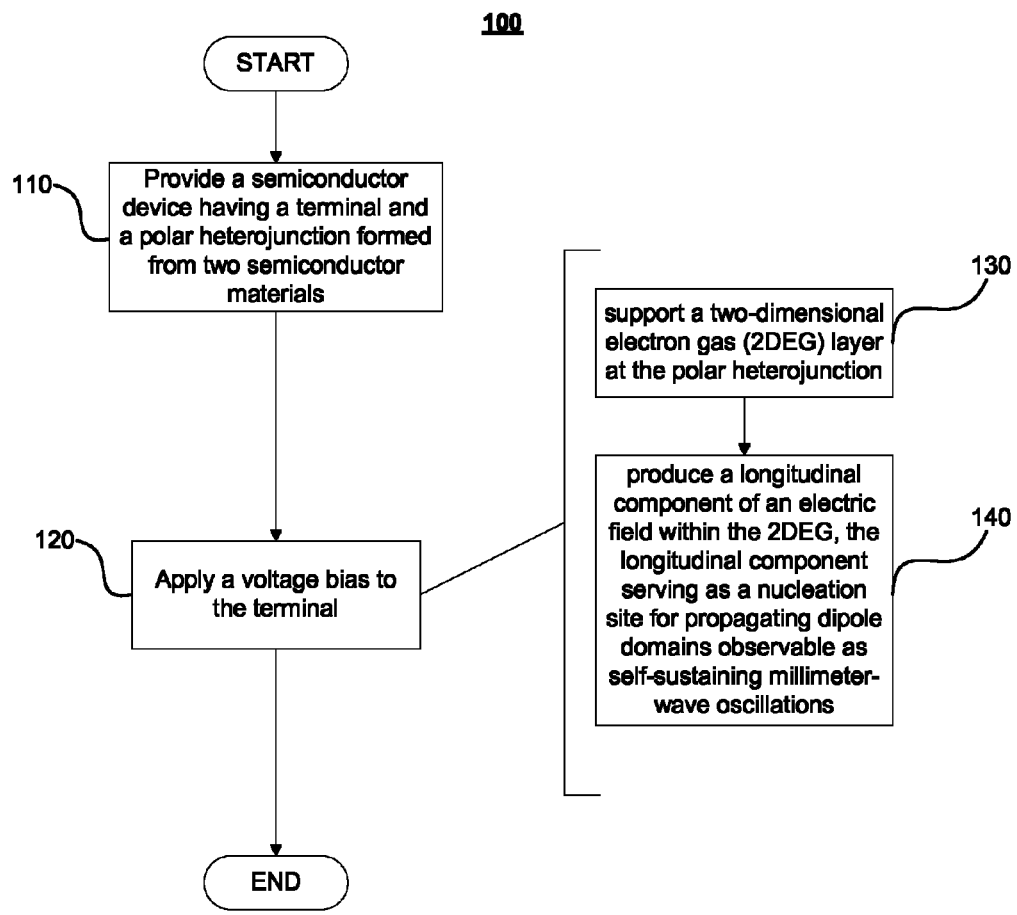
FIG. 1 provides a block diagram of a method for generating millimeter-wave oscillations in accordance with an exemplary embodiment of the present invention.

The following detailed description refers to the accompanying drawings. Wherever possible, the same reference numbers are used in the drawings and the following description to refer to the same or similar parts. While several exemplary embodiments and features of the invention are described herein, modifications, adaptations and other implementations are possible, without departing from the spirit and scope of the invention. For example, substitutions, additions or modifications may be made to the components illustrated in the drawings, and the exemplary methods described herein may be modified by substituting, reordering, or adding steps to the disclosed methods or processes. Accordingly, the following detailed description does not limit the invention. Instead, the proper scope of the invention is defined by the appended claims.

FIG. 1 provides a block diagram of a method 100 for generating millimeter-wave oscillations in accordance with an exemplary embodiment of the present invention. At a step 110, a semiconductor device having electrical terminals and a polar heterojunction formed from two semiconductor materials is provided. Methods and circuit embodiments consistent with the present invention include, for example, a triode structure having a cathode, anode, and a control. In some embodiments, the semiconductor device may even be a high electron mobility transistor (HEMT). Alternatively, the semiconductor device may be a diode. Furthermore, regardless of the chosen semiconductor device, a polar heterojunction may be formed at an interface between any two appropriate materials. These materials need only be selected so that a sufficiently large two-dimensional electron gas (2DEG) forms at the polar heterojunction, and under the application of a sufficient voltage bias (as discussed below with regard to step 120), the longitudinal component of a spatially-localized spike in the electric field profile at the polar heterojunction is enhanced sufficiently to serve as a nucleation site for propagating dipole domains observable as high-frequency oscillations. The ability of the semiconductor device to experience the onset of propagating dipole domains depends upon 1) the total fixed spontaneous and piezoelectric polarization sheet charge density of the polar heterojunction, 2) the total interfacial free electron sheet charge density of the polar heterojunction and 3) the applied voltage bias, where total interfacial free electron sheet charge density refers to the number of free electrons within the 2DEG layer or "sheet."

The total fixed spontaneous and piezoelectric sheet charge density may be calculated as the sum of the net piezoelectric polarization charge density and the net spontaneous polarization charge density associated with the interface of the two materials forming the polar heterojunction (total interfacial sheet charge density=Δpiezoelectric polarization+Δspontaneous polarization), and is closely related to the total interfacial free electron sheet charge density which forms due to electrostatic attraction Piezoelectric polarization refers to the fixed interfacial sheet charge that may arise in the presence of strain due to the piezoelectric nature of the materials, while spontaneous polarization refers to the fixed interfacial sheet charge that may arise at the interface between dissimilar anisotropic alloys. In preferred embodiments, material combinations having high total interfacial sheet polarization charges are selected for their ability to enhance a 2DEG layer and, with proper biasing of electrical terminals, produce a sufficiently large but spatially-localized longitudinal component in the electric field. Material combinations have this property may designed through various techniques, including, for example, strain engineering and/or the addition of a Shottky contact. Furthermore, under an appropriate voltage bias across the device terminals, preferred material combinations experience an enhanced 2DEG layer at the polar heterojunction, whereby a spatially localized and sharply peaked longitudinal component of an electric field is produced as a result of free electrons being attracted to and gathering within the 2DEG layer.

In some embodiments, a polar heterojunction may be formed from two wurtzite Group III-nitride materials. As displacive ferroelectrics, wurtzite III-nitride materials exhibit a relatively large spontaneous electrical polarization along their c-axis. As a consequence, they advantageously experience a relatively high electron density in the presence of a fixed interfacial charge. This effect results arises at the polar heterojunction between Group III-nitride materials due to a high correlation in the positions of interfacial lattice sites, where the polarization charge exists. By way of example, the biaxial tensile strain in pseudomorphic epitaxial layers of AlGaN grown on unstrained GaN induces a significant piezoelectric polarization charge at the interface. Furthermore, Ga-face growth results in a positive fixed piezoelectric as well as a positive spontaneous polarization sheet charges. Accordingly, even under modest strain, fixed sheet charge densities in excess of $10^{-6}$ C/cm² may be realized, thereby attracting large numbers of free electrons to form a high-density 2DEG. For example, in some embodiments according to the present invention, the polar heterojunction may form an enhanced 2DEG layer that is an order of magnitude larger than possible in structures based on conventional silicon or other compound semiconductor technologies. In addition, some structures consistent with embodiments of the invention do not require intentional doping. This feature advantageously avoids the scattering and otherwise degraded device performance associated with the high doping levels required in other device materials.

It should be noted, however, that material combinations that inherently exhibit a high net polarization charge are not necessarily required. Other embodiments within the scope of the present invention may be formed by material combinations with relatively lower total net polarization charges. By increasing the applied voltage bias, one may compensate for the lower total interfacial sheet charge and thereby support the creation of dipole instabilities in the 2DEG above the threshold for generating propagating dipole domains.

Next, at step 120, a voltage biases may be applied to the device terminals. As shown in concurrent steps 130 and 140, this voltage bias may be adapted to enhance a 2DEG layer at the polar heterojunction and produce a sufficiently large longitudinal component serving as a nucleation site for propagating dipole domains observable as self-sustaining millimeter-wave oscillations. Preferably, the applied voltage bias is selected such that the induced longitudinal component in the 2DEG layer is spatially localized and sharply peaked. It is at the location of the longitudinal component occurs where a nucleation site for propagating dipole domains may occur. For example, in a triode structure having a source (cathode), an anode (drain), and a control (gate), a voltage bias may be established between the gate and source terminals, $V_{GS}$, and the drain and source terminals, $V_{DS}$. In some embodiments, this voltage bias is achieved by disposing the semiconductor device within a bias circuit in which components are selected and arranged such that, under an applied input voltage, $V_{GS}$ and $V_{DS}$ cause field crowding underneath the drain edge of the gate electrode. At sufficient gate and drain bias with respect to the source electrode, this field crowding may generate a longitudinal component of the electric field within the channel in excess of the threshold for negative differential drift velocity. The location of this spike in the longitudinal electric field may serve as a nucleation site for dipole instabilities.

As a result, dipole domains may propagate from one device terminal toward another, e.g., from the gate to the drain. At their peak, lateral electric fields within the traveling domains may be over an order of magnitude larger than the peak fields associated with bulk-like Gunn domains observed in conventional zinc-blende materials. As a consequence, charge transport within these traveling domains may resemble damped Bloch oscillations, which are quasi-ballistic rather than directly related to stationary velocity-field profiles of electrons in bulk materials. In some embodiments, a sensing device (e.g., a current tap) may be coupled to the output terminal or a load associated therewith to observe the periodic oscillations in the current magnitude at the terminal.

Figure 3:
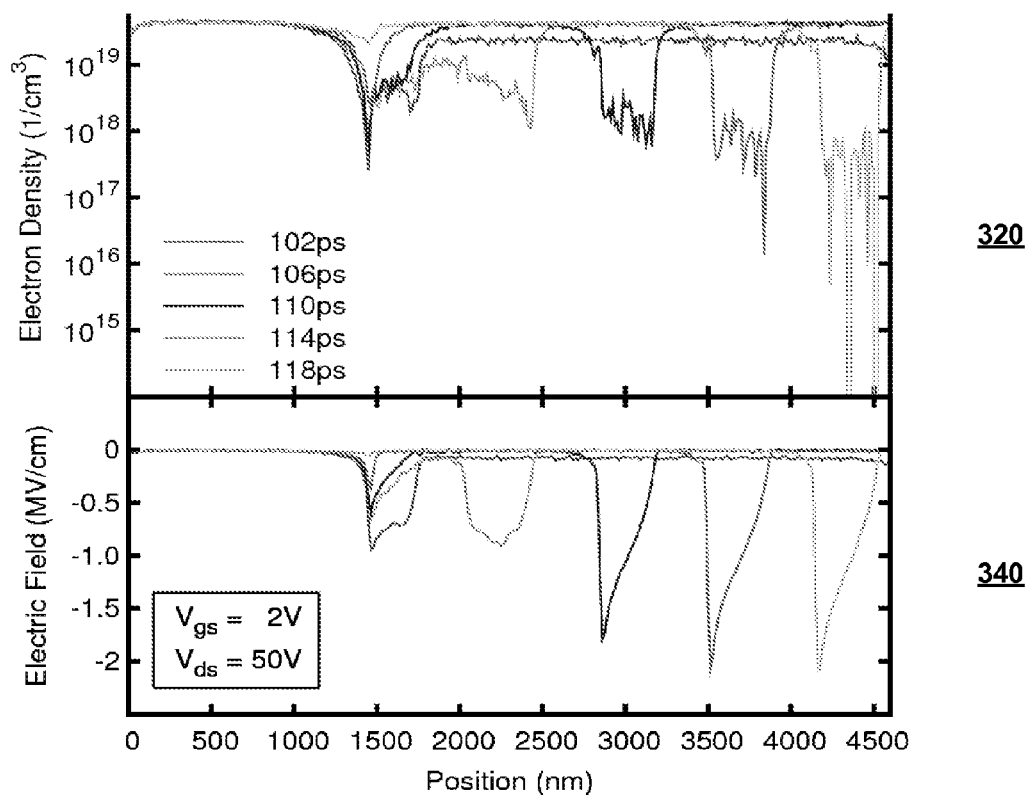
FIG. 3 provides graphs illustrating dipole domains propagating from a nucleation site to a drain terminal in accordance with an exemplary embodiment of the present invention.

Embodiments consistent with the present invention may operate in at least two different modes of operation. Referring momentarily to FIG. 3 (graph 340) and FIG. 5 (graph 500), these graphs illustrate exemplary instances of a first and second modes of operation characterized by a high-frequency type of self-sustaining oscillation and an ultra-high-frequency type of self-sustaining oscillation, respectively. The particular frequencies and magnitudes depicted in these graphs are associated with one exemplary embodiment and are referred to herein for the purposes of example, not limitation. One of ordinary skill in the art, upon reading this specification, will be able to achieve other desired oscillation frequencies without undue experimentation while still falling within the scope and spirit of the invention, as set forth in the appended claims. For example, it is noted that oscillation frequencies may be increased or decreased by adjusting the distance between the semiconductor device's input and output terminals. In a triode structure, for example, increasing the distance between the control and the anode results in higher frequency oscillations.

A first mode, also referred to herein as the "depletion-layer mode" of operation is characterized by high-frequency oscillations of the type shown in graph 340, which occur at a relatively higher average voltage bias than those exhibited in graph 500. Further, the high-frequency oscillations are characterized by larger magnitude current oscillations at the output terminal, but a relatively lower frequency. Embodiments of the invention may therefore operate in normal mode by applying a relatively higher average voltage bias selected so that the longitudinal component in the electric field within the 2DEG layer causes dipole domains to nucleate underneath an input terminal and to grow as they propagate toward an output terminal. In certain triode embodiments consistent with the present invention, the normal mode of operation may be accomplished by setting $V_{GS}$ at a relatively higher bias (assuming a constant $V_{DS}$) and is characterized by the nucleation of dipole domains under the drain edge of the gate electrode, and their growth and propagation towards the drain electrode, where they are collected.

A second mode, also referred to herein as the "internally quenched mode," of operation is characterized by the ultra-high frequency oscillations of the type shown in graph 500, which occur at a relatively lower average voltage bias than those exhibited in graph 340. Furthermore, the ultra-high frequency oscillations are characterized by lower magnitude current oscillations at the output terminal, but a relatively higher frequency. Embodiments of the invention may therefore operate in the internally quenched mode by applying a relatively lower average voltage bias selected so that the longitudinal component of the electric field within the 2DEG layer causes dipole domains to nucleate underneath an input terminal, but prematurely self quench after travelling a fraction of the channel length between the input and output terminals. In certain triode embodiments consistent with the present invention, the prematurely quenched mode of operation may be accomplished by setting $V_{GS}$ at a relatively lower bias (assuming a constant $V_{DS}$) and is characterized by the nucleation of dipole domains under the drain edge of the gate electrode, and their periodic, premature quenching as they travel toward the drain.

In another aspect of the invention, methods and circuits the semiconductor device may be selectably operated between depletion-layer mode and internally quenched mode. For example, an embodiment may provide a mechanism for varying the voltage between a first voltage bias adapted to cause the device to operate in the normal mode and a second voltage bias adapted to cause the device to operate in the prematurely quenched mode. This effect may be accomplished through various means including coupling a variable resistor between a voltage source and an input terminal associated with the semiconductor device. Possible types of variable resistors include the following non-limiting examples: a potentiometer, a resistance decade box, a rheostat, a thermistor, a metal oxide varistor, a photoresistor, a strain gauge, and the like. Alternatively, the voltage source itself may be variably tuned between desired levels through various means that will be appreciated by those of skill in the art.

Figure 2:
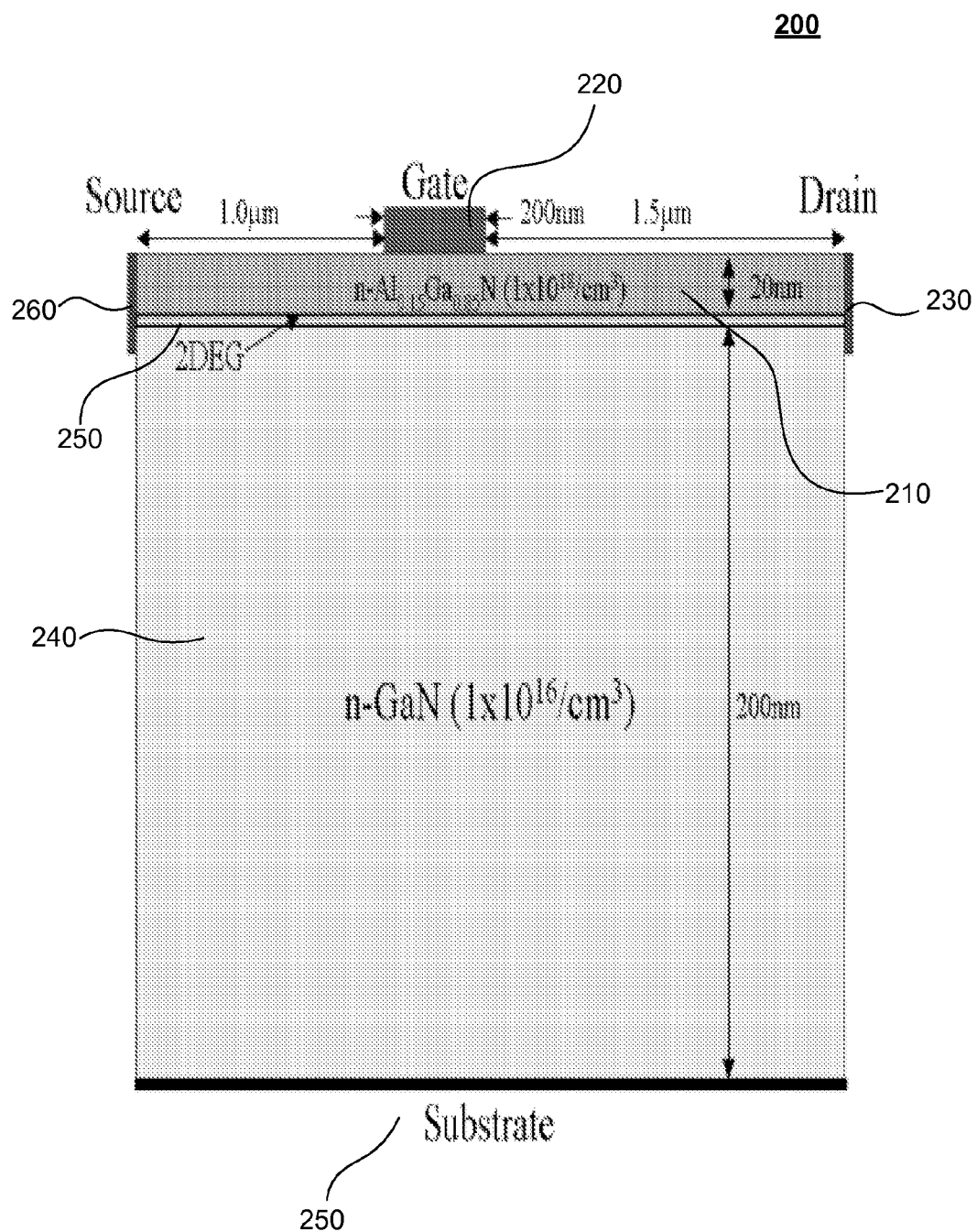
FIG. 2 illustrates a semiconductor device that may be used in exemplary method and circuit embodiments of the present invention.

FIG. 2 illustrates a semiconductor device that may be provided in exemplary method and circuit embodiments of the present invention. Device 200 contains an AlGaN/GaN-based triode structure including a gate 220, a source 260, and a drain 230. A polar heterojunction is formed from an n-$Al_{0.15}Ga_{0.85}$ material layer 210 doped at $1\times10^{18}/cm^3$, which is 20 nm thick, and an n-GaN layer 240 doped at $1\times10^{16}/cm^3$, which is 200 nm thick. A 2DEG layer 250 gathers below the polar heterojunction between the Al-Gan and GaN layers. In this exemplary embodiment, the distance between the source 260 and drain 230 is fixed at 1.0 µm, while the distance between the gate 220 and drain 230 is fixed at 1.5 µm. The gate 220 has a width of 200 nanometers.

Figure 4:
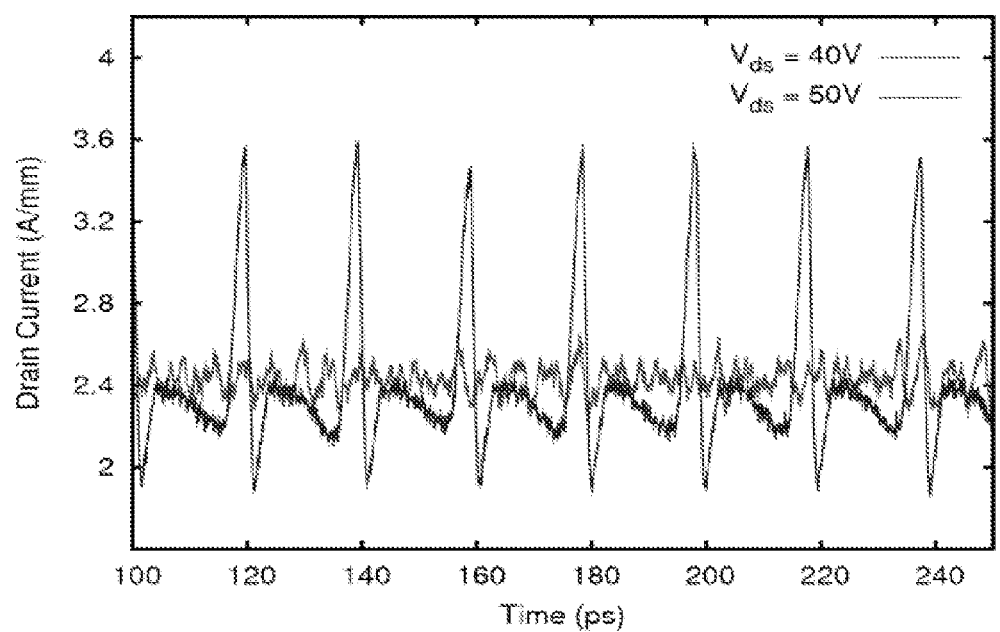
FIG. 4 provides a graph illustrating sensed load current oscillations in accordance with an exemplary embodiment of the present invention.

FIG. 3 provides graphs illustrating dipole domains propagating from a nucleation site to a drain terminal in accordance with an exemplary embodiment of the present invention operating in depletion-layer mode. Specifically, the graphs reflect the spatial profiles of electron density 320 and electric field strength 340 at five representative instants of time during one cycle of operation in an exemplary method and circuit incorporating the device described with reference to FIG. 2, above. In more detail, waveforms 320 and 340 reflect the operation of the exemplary triode device for the case of a 2V gate-source bias, an average drain-source bias of approximately 50V, and a 50 Ohm series load resistance. As shown in FIG. 4, oscillations at a rate of approximately 51 GHz are produced as propagating dipole domains demonstrating a transit time of 19 ps and an average speed of $1.75\times10^7$ cm/s. Furthermore, as shown in graph 340, at their peak, lateral electric fields within the 2DEG exceed 1 MV/cm—over an order of magnitude larger than peak fields associated with bulk-like Gunn domains observed in conventional zinc-blende materials.

Graph 340 further illustrates that, for the exemplary device provided in FIG. 2, a 2V gate-source bias and an average drain-source bias of approximately 50V, produces high-frequency mode propagating dipole domains. In this particular embodiment, a longitudinal spike in the electric field in the 2DEG creates the nucleation of a dipole instability at approximately 1300 nm, which is located below the drain edge side of gate 220. The resulting dipole domain grows and simultaneously propagates toward its ultimate collection at the drain electrode 230.

Figure 5:
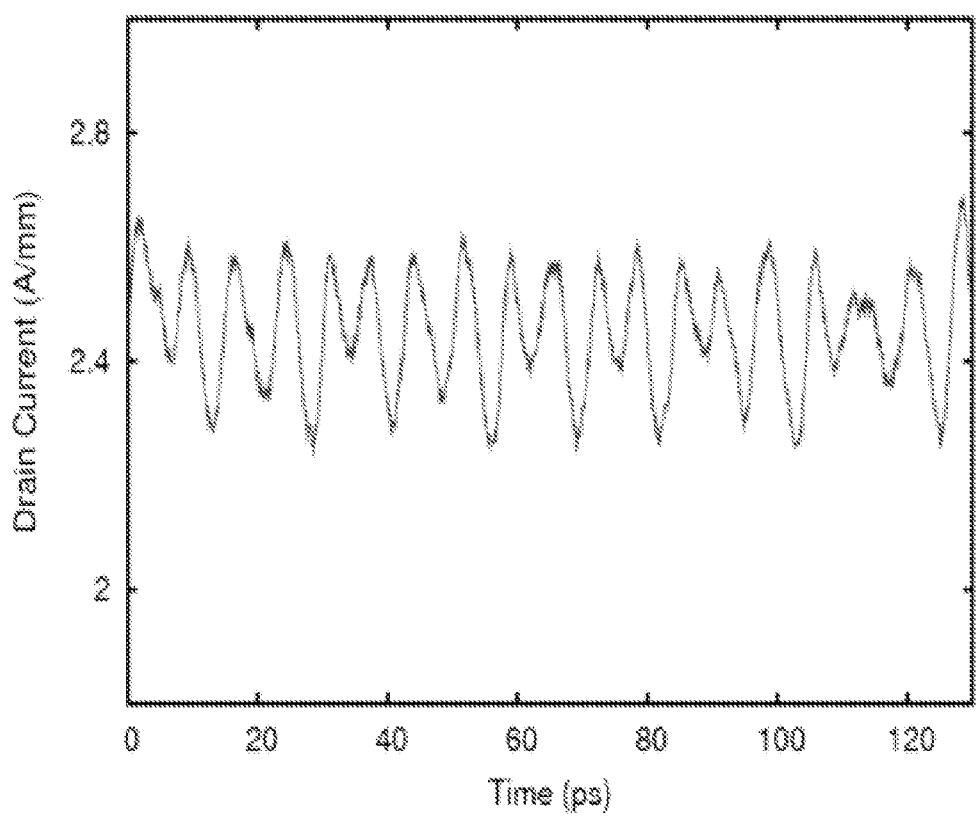
FIG. 5 provides a graph illustrating sensed load current oscillations in a prematurely quenched mode of operation in accordance with an exemplary embodiment of the present invention.

FIG. 5 provides a graph illustrating sensed load current oscillations in the internally quenched mode of operation in accordance with an exemplary method and circuit incorporating the device described with reference to FIG. 2, above. Waveform 500 reflects the operation of the exemplary triode device for the case of a 2V gate-source bias and a 47.5V drain-source bias. Under the application of this voltage bias, traveling dipole domains travel from gate to drain, but prematurely self-quench after traversing only a fraction of the channel length between gate and drain electrodes. As shown in waveform 500, this prematurely quenched mode of operation exhibits self-sustaining periodic oscillations of approximately 154 GHz. This prematurely quenched mode of operation enables faster oscillations, but at a relatively lower magnitude.

Oscillation frequencies may be increased or decreased by adjusting the distance between the semiconductor device's input and output terminals. In a triode structure, for example, increasing the distance between the gate and the drain results in higher frequency oscillations in both the depletion-layer and prematurely quenched modes of operation, assuming the same gate-source and drain-source voltages.

Figure 6:
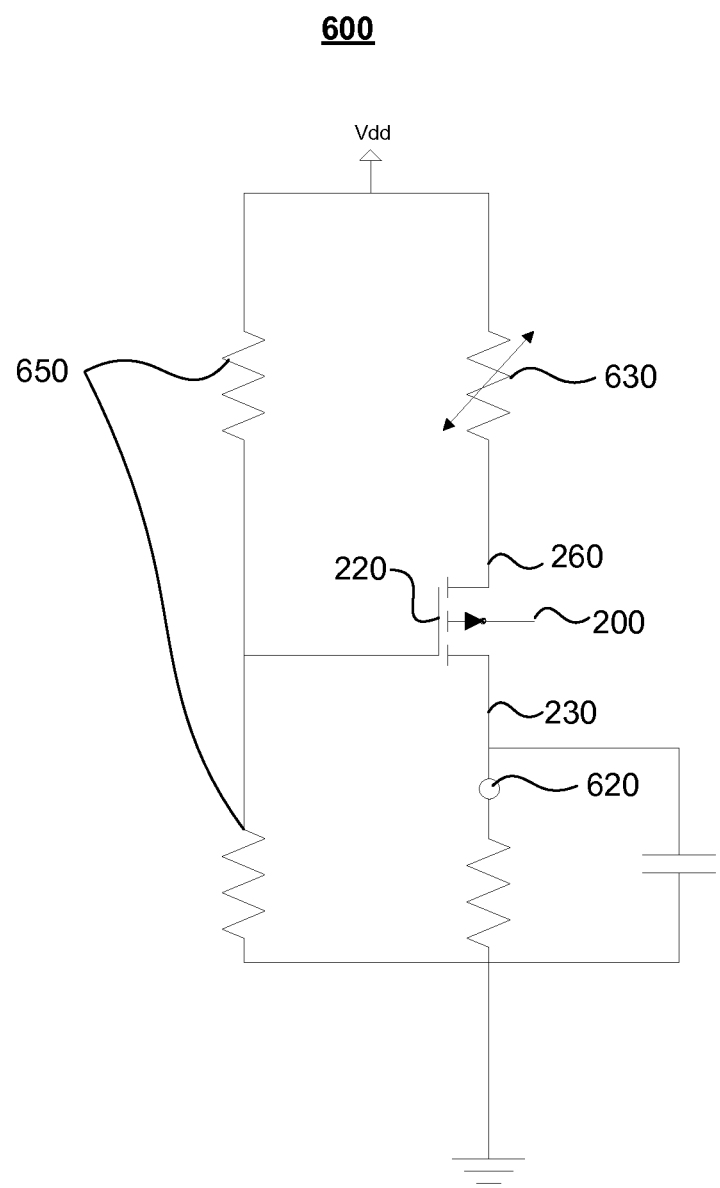
FIG. 6 illustrates an oscillator circuit in accordance with an exemplary embodiment of the present invention.

FIG. 6 illustrates an oscillator circuit in accordance with an exemplary embodiment of the present invention. Specifically, circuit 600 provides an exemplary bias circuit that may be used to generate millimeter wave oscillations consistent with the present invention. A semiconductor device 200 may have a gate 220, source 260, and a drain 230. The circuit may be supplied with a voltage source $V_{dd}$ and one or more resistors, e.g., resistors 650. The circuit may also include a variable resistor 630. Voltage source $V_{dd}$ and resistors 650 and 630 may be selected and arranged such that they supply a voltage bias to the device 220 terminals adapted to enhance a 2DEG layer at the polar heterojunction and produce a longitudinal component in the electric field in order to nucleate propagating dipole domains observable as self-sustaining millimeter-wave oscillations. A current-sensing element 620, such as a current tap, or other circuit device capable of sensing current variations, may be coupled to the drain terminal 230 in order to sense current oscillations.

Methods and circuit embodiments according to the present invention have many significant advantages over known devices capable of producing millimeter-wave oscillations. Significantly, devices and circuits operated according to the present invention permit may produce millimeter-wave oscillations at room temperature, unlike Gunn diodes, which, though they have been theorized, have not been achieved in practice. Moreover, devices and circuits operating in accordance with the present invention may be employed on a small scale at a low cost. Consequently, they are more desirable than currently known devices capable of producing millimeter-wave oscillations at room temperature, such as traveling wave tubes and low-power semiconductor sources, which are expensive, bulky, and fragile.

As a result, devices and circuits operated according to the present invention have a diverse array of potential applications.

Embodiments of the present invention are further illustrated by the following non-limiting example.

EXAMPLES

The following case was simulated using full-band ensemble Monte Carlo simulation to study the microscopic operation of an example device, as describe herein in reference to FIG. 2. The exemplary device depicted in the two-dimensional, cross-sectional illustration of FIG. 2 includes source (cathode), drain (anode), and gate (control) electrodes. The former two contacts, in contrast to the gate electrode, are Ohmic. A relatively large gate bias served to further increase sheet electron density in the 2DEG below the gate. Through the phenomenon of field crowding, the gate electrode induced an additional large gradient in the longitudinal component of electric field at the 2DEG interface, which facilitated the initiation and launching of traveling domains towards the anode.

Figure 7:
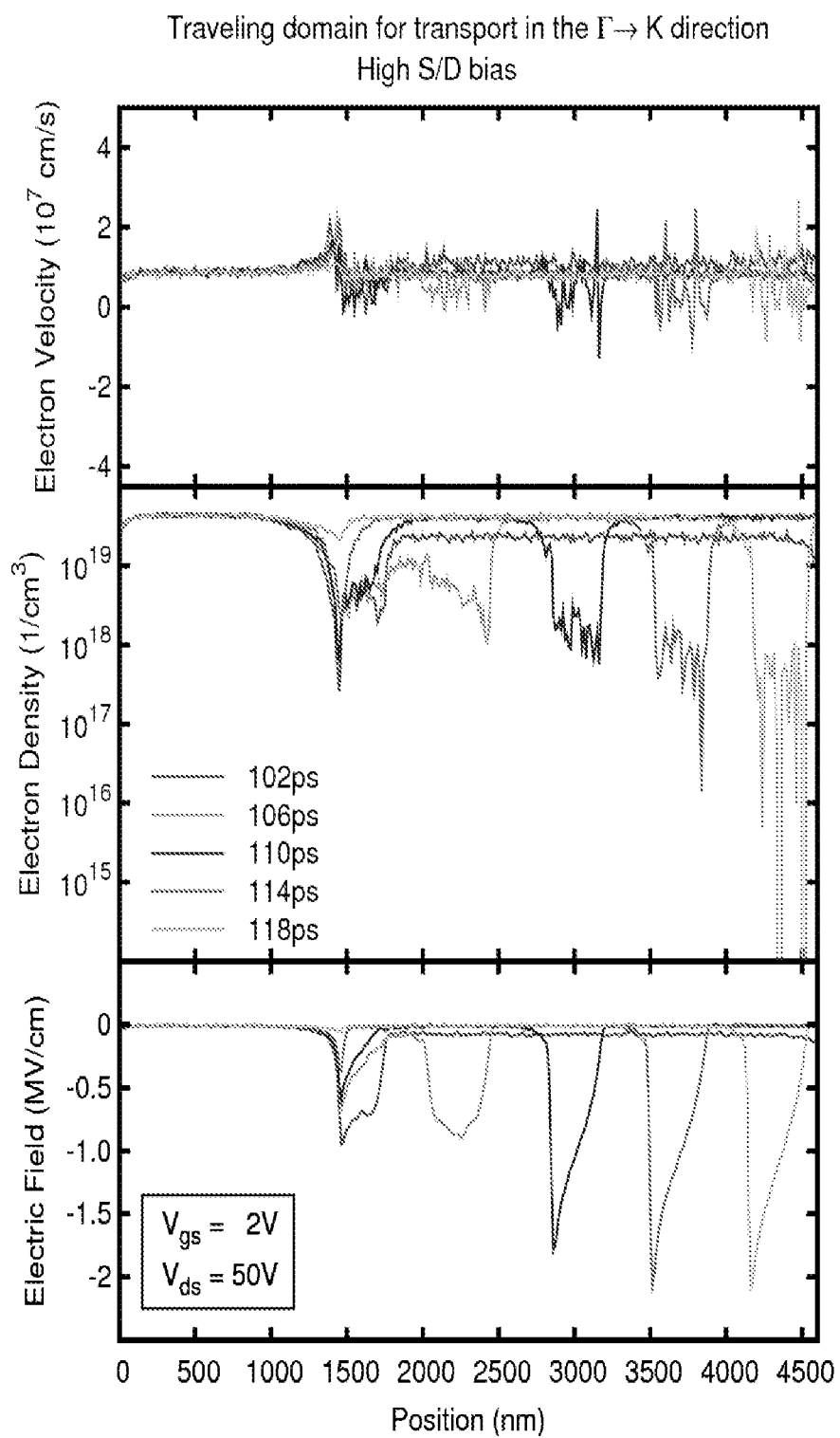
FIG. 7 provides graphs of the temporal evolution of a longitudinal electric field profile, electron density, and average electron velocity in a depletion-layer mode observed in an example consistent with the present invention.
Figure 8:
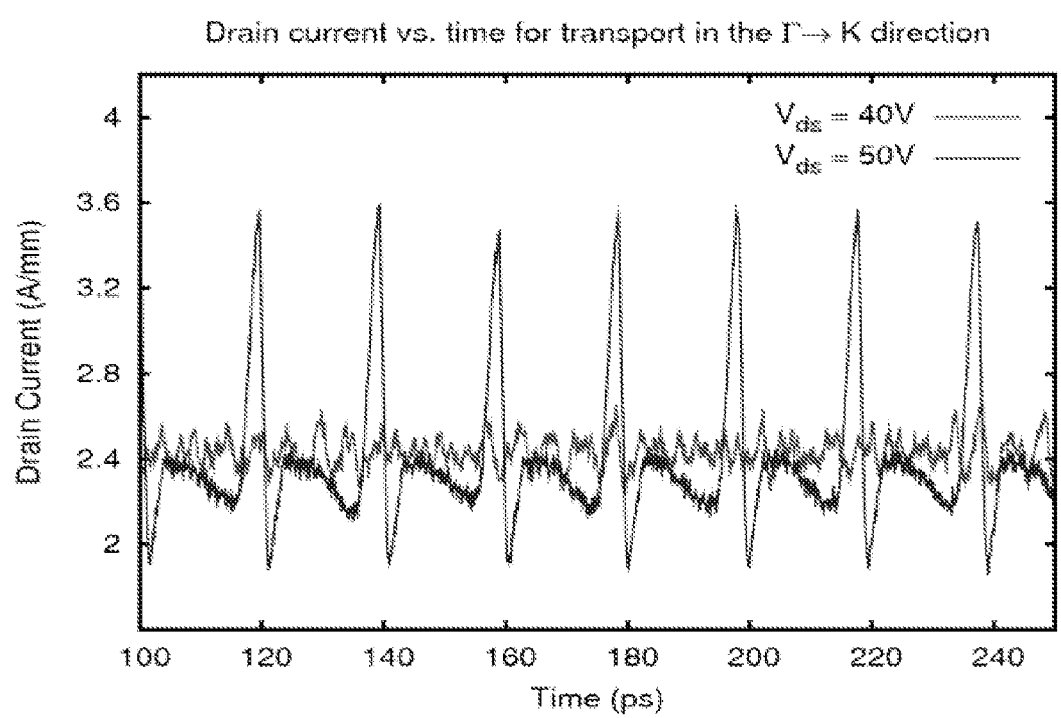
FIG. 8 provides a graph of a periodic anode current wave form in a depletion-layer mode observed in an example consistent with the present invention.

The simulation revealed two modes of operation. A traveling depletion-layer domain was observed under a gate bias of 2V and a drain-source bias of 50V. In this mode of operation, the channel supported one domain at a time. The depletion layer traveled along the channel from the position of the gate electrode to the anode, where it was annihilated, at which time the formation of a new domain began underneath the gate electrode to begin the subsequent cycle. The observed microscopic operation is depicted in FIG. 7, and the observed anode current is shown FIG. 8. It was determined that the frequency of oscillation depends largely on the spacing of gate and drain electrodes.

Figure 9:
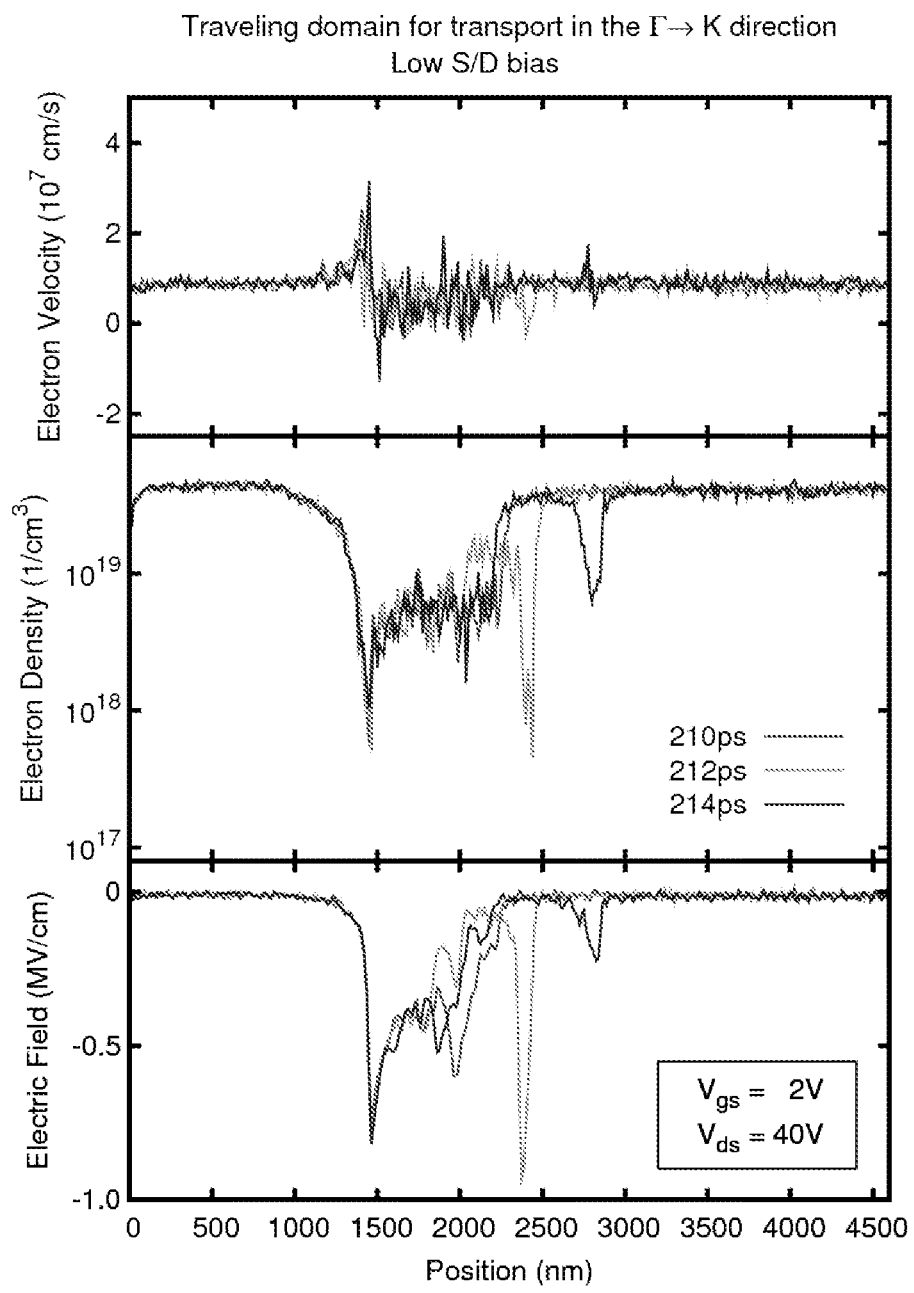
FIG. 9 provides graphs of the temporal evolution of a longitudinal electric field profile, electron density, and average electron velocity in an internally quenched mode observed in an example consistent with the present invention.
Figure 10:
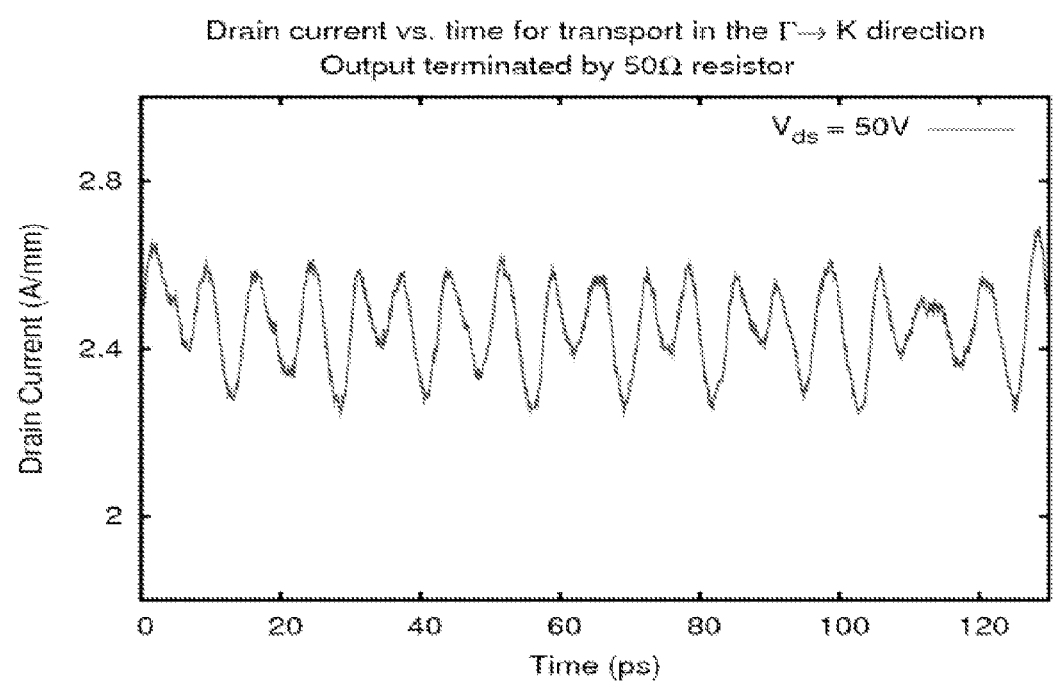
FIG. 10 provides a graph of a periodic anode current waveform in an internally quenched mode observed in an example consistent with the present invention.

A second mode of operation was observed at slightly lower drain biases, in which traveling depletion-layer domains are internally quenched and never reach the anode, but support several simultaneous domains. The observed microscopic operation is shown in FIG. 9. As shown in FIG. 10, considerably faster oscillation period was observed in this mode, though the oscillations had a somewhat decreased magnitude.

The origin of the oscillations produced the devices is different from the inter-valley transfer mechanism responsible for the Gunn effect. Relevant field strengths associated with the Gunn effect are on the order of a few kV/cm. Bloch oscillations produced here, however, have a much longer time scale than that of inter-valley transfer. The characteristic longitudinal field strength in simulated device is approximately 1 MV/cm, in which case the characteristic time scale for Bloch oscillations is approximately 0.1 ps. This time scale is shorter than the time scale for inter-valley transfer. As a result, quasi-stationary velocity-field characteristics are appropriate for the analysis of Gunn-effect devices. As a result, the motion of electrons in the traveling domains of the proposed devices is partially ballistic, and therefore different from the quasi-stationary transport which exists in Gunn domains.

Accordingly, adjustment of the bias on the control electrode, and design of the thickness and material composition of the insulation material may enable control over the electrostatic profile and sheet electron density in the active region. These properties in turn may enable control over the character, growth and velocity of traveling domains in 2DEGs, and ultimately the power generation and oscillation frequency. Due to the ballistic nature of transport in the proposed methods and circuits, considerably higher frequency operation may be achieved.

The foregoing description of possible implementations consistent with the present invention does not represent a comprehensive list of all such implementations or all variations of the implementations described. The description of only some implementations should not be construed as an intent to exclude other implementations. It will be apparent to those skilled in the art that many modifications, additions, and deletions can be made therein without departing from the spirit and scope of the invention and its equivalents as set forth in the following claims.

What is claimed is:

1. A method for generating millimeter-wave oscillations comprising:
    providing a semiconductor device in an environment at about room temperature, the semiconductor device comprising at least two terminals and a polar heterojunction formed from two semiconductor materials;
    applying a first set of voltage biases to the terminals in a first mode; and
    applying a second set of voltage biases to the terminals in a second mode wherein an average value of the second set of voltage biases is higher than an average value of the first set of voltage biases;
    wherein each of the first voltage biases and the second voltage biases is adapted to:
        enhance a two-dimensional electron gas (2DEG) layer at the polar heterojunction, and
        produce a longitudinal component of an electric field within the 2DEG, wherein the longitudinal component of the electric field serves as a nucleation site for a plurality of propagating dipole domains observable as a plurality of self-sustaining millimeter-wave oscillations;
    wherein a first frequency associated with the first mode is higher than a second frequency associated with the second mode.

2. The method of claim 1, wherein the semiconductor device is a triode comprising a cathode, an anode, and a control, wherein a first of the first set of voltage biases is applied to the control with respect to the cathode, and a second of the first set of voltage biases is applied to the anode with respect to the cathode.

3. The method of claim 1, further comprising configuring the semiconductor device to be selectable between the first mode and second mode.

4. The method of claim 1, wherein the polar heterojunction is formed from two wurtzite Group III-nitride materials.

5. The method of claim 1, further comprising sensing the plurality of propagating dipole domains as a plurality of self-sustaining oscillations.

6. The method of claim 5, wherein sensing the plurality of propagating dipole domains further comprises coupling a load to the device and sensing a current associated with the load.

7. An oscillator circuit comprising:
    a semiconductor device in an environment at about room temperature, the semiconductor device comprising:
        at least two terminals; and
        a polar heterojunction in communication with the at least two terminals, the polar heterojunction formed from two semiconductor materials;
    a voltage source; and
    a resistor;
    wherein the voltage source and resistor are configured to supply a first set of voltage biases to the at least two terminals in a first mode and second set of voltage biases to the at least two terminals in a second mode, wherein an average value of the second set of voltage biases is higher than an average value of the first set of voltage biases, the first and second set of voltage biases being adapted to:
        enhance a two-dimensional electron gas (2DEG) layer at the polar heterojunction, and
        produce a longitudinal component of an electric field within the 2DEG, wherein the longitudinal component of the electric field serves as a nucleation site for a plurality of propagating dipole domains observable as a plurality of self-sustaining millimeter-wave oscillations;
    wherein a first frequency associated with the first mode is higher than a second frequency associated with the second mode.

8. The oscillator circuit of claim 7, wherein the semiconductor device is a triode comprising a cathode, an anode, and a control, wherein a first of the first set of voltage biases is applied to the control with respect to the cathode, and a second of the first set of voltage biases is applied to the anode with respect to the cathode.

9. The oscillator circuit of claim 8, wherein the triode is a high electron mobility transistor (HEMT).

10. The oscillator circuit of claim 7, wherein the semiconductor device is adapted to be selectable between the first mode and the second mode.

11. The oscillator circuit of claim 7, wherein the polar heterojunction is formed from two wurtzite Group III-nitride materials.

12. The oscillator circuit of claim 7, further comprising a current sensing element configured to sense current oscillations.

13. The oscillator circuit of claim 12, wherein the current sensing element comprises a load coupled to the device.

* * * * *